United States Patent
Kamatani

(10) Patent No.: US 7,592,855 B2
(45) Date of Patent: Sep. 22, 2009

(54) TRIMMING CIRCUIT AND SEMICONDUCTOR DEVICE

(75) Inventor: Tomohiko Kamatani, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 281 days.

(21) Appl. No.: 11/821,457

(22) Filed: Jun. 21, 2007

(65) Prior Publication Data

US 2008/0012624 A1  Jan. 17, 2008

(30) Foreign Application Priority Data

Jul. 11, 2006  (JP)  ............................. 2006-190558

(51) Int. Cl.
 *H01H 37/76* (2006.01)
(52) U.S. Cl. .................. 327/525; 327/530; 327/334; 365/189.01; 365/225.7
(58) Field of Classification Search ................ 327/525, 327/526, 530, 334, 113, 536, 514; 365/189.01, 365/189.05, 201, 226, 225.7, 185.23, 236
See application file for complete search history.

(56) References Cited

U.S. PATENT DOCUMENTS 4,446,534 A * 5/1984 Smith ........................... 365/96
4,686,384 A * 8/1987 Harvey et al. ................ 327/530
4,990,846 A * 2/1991 Buck et al. ................... 323/314
6,462,609 B2 * 10/2002 Hashimoto et al. .......... 327/525
6,815,941 B2 * 11/2004 Butler ......................... 323/313
7,158,435 B2 * 1/2007 Kobayashi et al. ......... 365/225.7
7,254,080 B2 * 8/2007 Kimura ..................... 365/225.7

FOREIGN PATENT DOCUMENTS

JP    2002-26258    1/2002
JP    2005-301409   10/2005

* cited by examiner

*Primary Examiner*—Rajnikant B Patel
(74) *Attorney, Agent, or Firm*—Cooper & Dunham, LLP

(57) ABSTRACT

A trimming circuit is disclosed. The trimming circuit includes a first trimming circuit having resistors and fuses, and a second trimming circuit having a resistor, an NMOS transistor, and a control circuit. The control circuit includes an inverter circuit and a series circuit in which a resistor and fuses are connected in series. The first trimming circuit is connected with a reference resistor in series and the second trimming circuit is connected with the reference resistor in parallel.

13 Claims, 7 Drawing Sheets

TRIMMING CIRCUIT AND SEMICONDUCTOR DEVICE

BACKGROUND OF THE INVENTION

1. Field of the Invention

The present invention generally relates to a trimming circuit for adjusting a combined resistance value, in which a resistance value of a reference resistor is combined with a resistance value obtained by cutting a fuse(s) in the trimming circuit, to a target resistance value and a semiconductor device using the trimming circuit.

2. Description of the Related Art

Conventionally, as a resistance value adjusting circuit which adjusts a resistance value formed in a semiconductor device to a target resistance value, trimming circuits shown in FIGS. 1 and 2 have been frequently used.

FIG. 1 is a conventional trimming circuit diagram using fuses. As shown in FIG. 1, a trimming circuit D1 is disposed between a resistor R0 connected to a terminal P1 and a resistor R3 connected to a terminal P2. The trimming circuit D1 provides resistors R1 and R2, and fuses F1 and F2. Each of the fuses F1 and F2 is cut by a high energy beam such as a laser beam, or the fuse F1 is cut by a large current supplied between terminals T1 and T2, or the fuse F2 is cut by a large current supplied between terminals T2 and T3.

Between the terminals P1 and P2, a combined resistance value before cutting the fuses F1 and F2 is "R0+R3". When the fuse F1 is cut, the combined resistance value between the terminals P1 and P2 is "R0+R1+R3". When the fuses F1 and F2 are cut, the combined resistance value between the terminals P1 and P2 is "R0+R1+R2+R3". Therefore, in the trimming circuit D1 shown in FIG. 1, since the combined resistance value between the terminals P1 and P2 can be increased by the trimming, when the combined resistance value is adjusted to be increased, the trimming circuit D1 shown in FIG. 1 is used. Therefore, the combined resistance value between the terminals P1 and P2 before adjustment by the trimming must be less than a target resistance value to be adjusted.

FIG. 2 is a conventional trimming circuit diagram using Zener diodes. As shown in FIG. 2, a trimming circuit D2 uses Zener diodes Z1 and Z2 instead of the fuses F1 and F2 shown in FIG. 1.

In FIG. 2, resistors R1 and R2 are connected in series, and a Zener diode Z1 is connected with the resistor R1 in parallel and a Zener diode Z2 is connected with the resistor R2 in parallel. The voltage drop in the resistor R1 does not exceed the breakdown voltage of the Zener diode Z1, and the voltage drop in the resistor R2 does not exceed the breakdown voltage of the Zener diode Z2.

The Zener diode Z1 is broken by having applied a high reverse bias voltage between terminals T1 and T2 so that the circuit between the terminals T1 and T2 becomes a short circuit. The Zener diode Z2 is broken by having applied a high reverse bias voltage between terminals T2 and T3 so that the circuit between the terminals T2 and T3 becomes a short circuit. In addition, each of the Zener diodes D1 and D2 can be broken by zapping.

The combined resistance value between the terminal P1 and P2 before breaking the Zener diodes Z1 and Z2 is "R0+R1+R2+R3". When the Zener diode Z1 is broken, the combined resistance value between the terminal P1 and P2 is "R0+R2+R3". When the Zener diode Z2 is broken, the combined resistance value between the terminal P1 and P2 is "R0+R1+R3". When the Zener diodes Z1 and Z2 are broken and become short circuits between the terminals T1 and T3, the combined resistance value between the terminal P1 and P2 is "R0+R3". Therefore, in the trimming circuit D2 shown in FIG. 2, since the combined resistance value between the terminals P1 and P2 can be decreased by the trimming, when the combined resistance value is adjusted to be decreased, the trimming circuit D2 shown in FIG. 2 is used. Therefore, the combined resistance value between the terminals P1 and P2 before adjustment by the trimming must be greater than a target resistance value to be adjusted.

In the trimming circuits shown in FIGS. 1 and 2, the difference between the combined resistance values before and after the trimming is large.

In addition, as shown in FIG. 2, when the combined resistance value before adjustment is greater than that after the adjustment, since a large current flows into the circuit before the trimming, current capacity of a semiconductor device such as a transistor which is connected to the trimming circuit must be large. Consequently, the size of an IC chip including the semiconductor device must be large. In order to solve the above problem, a trimming circuit shown In FIG. 3 is disclosed.

FIG. 3 is a conventional trimming circuit diagram which is disclosed in Patent Document 1. As shown in FIG. 3, a trimming circuit D3 uses resistors R1 and R2, a Zener diode Z1, and a fuse F1. In the trimming circuit D3, the resistors R1 and R2 are connected in series, the Zener diode Z1 is connected with the resistor R1 in parallel, and the fuse F1 is connected with the resistor R2 in parallel. The voltage drop in the resistor R1 does not exceed the breakdown voltage of the Zener diode Z1.

When a high reverse bias voltage is applied between terminals T1 and T2, the Zener diode Z1 can be a short circuit. When a large current is supplied between terminals T2 and T3, the fuse F1 can be cut.

The combined resistance value between the terminal P1 and P2 before adjustment by the trimming is "R0+R1+R3". When the Zener diode Z1 is broken, the combined resistance value between the terminal P1 and P2 is "R0+R3". When the fuse F1 is cut, the combined resistance value between the terminal P1 and P2 is "R0+R1+R2+R3". When the Zener diode Z1 is broken and the fuse F1 is cut, the combined resistance value between the terminal P1 and P2 is "R0+R2+R3".

Therefore, in the trimming circuit D3 shown in FIG. 3, when a combined resistance value before adjustment is greater than a target resistance value to be adjusted, the combined resistance value can be decreased by breaking the Zener diode Z1. When the combined resistance value before adjustment is less than the target resistance value to be adjusted, the combined resistance value can be increased by cutting the fuse F1. Therefore, the combined resistance value between the terminals P1 and P2 can be close to the target resistance value.

[Patent Document 1] Japanese Laid-Open Patent Application No. 2002-26258

However, in the trimming circuit using the Zener diode shown in FIG. 3, a terminal for applying the high reverse bias voltage to the Zener diode Z1 is required. When the number of the Zener diodes is increased in an IC chip, the number of the terminals is increased. Therefore, when high accuracy in the trimming is required, the area for the terminals is increased and the cost of the IC chip is increased.

In addition, since the high reverse bias voltage is applied to the Zener diode to break the Zener diode, a circuit for preventing influence of the high reverse bias voltage on an internal circuit connecting to the trimming circuit must be provided. When the size of the Zener diode is small, the high reverse bias voltage can be lowered, the influence on the internal circuit can be prevented, and the number of the Zener diodes per area can be increased.

However, even in the above case, the Zener diode may be broken by a surge voltage caused by static electricity via the terminal for applying the high reverse bias voltage and the adjustment by the trimming may be changed. In addition, since dispersion of residual resistance values of the broken Zener diodes has several 10 KΩ, it is difficult to obtain high accuracy in the adjustment by the trimming.

SUMMARY OF THE INVENTION

In a preferred embodiment of the present invention, there is provided a trimming circuit and a semiconductor device using the trimming circuit that can adjust a combined resistance value, in which a resistance value of a reference resistor is combined with a resistance value in the trimming circuit, to a target resistance value without using a Zener diode.

Features and advantages of the present invention are set forth in the description that follows, and in part will become apparent from the description and the accompanying drawings, or may be learned by practice of the invention according to the teachings provided in the description. Features and advantages of the present invention will be realized and attained by a trimming circuit and a semiconductor device using the trimming circuit particularly pointed out in the specification in such full, clear, concise, and exact terms as to enable a person having ordinary skill in the art to practice the invention.

To achieve one or more of these and other advantages, according to one aspect of the present invention, there is provided a trimming circuit that adjusts a combined resistance value, in which a resistance value of a reference resistor is combined with a resistance value obtained by cutting one or more fuses in the trimming circuit, to a target resistance value. The trimming circuit includes a first trimming circuit which makes the combined resistance value after the adjustment by cutting the one or more fuses greater than the combined resistance value before the adjustment by cutting the one or more fuses, and a second trimming circuit which makes the combined resistance value after the adjustment by cutting the one or more fuses less than the combined resistance value before the adjustment by cutting the one or more fuses. The first trimming circuit is connected to the reference resistor in series and the second trimming circuit is connected to the reference resistor in parallel.

According to another aspect of the present invention, there is provided a semiconductor device. The semiconductor device includes a trimming circuit that adjusts a combined resistance value in which a resistance value of a reference resistor is combined with a resistance value obtained by cutting one or more fuses in the trimming circuit to a target resistance value. The trimming circuit includes a first trimming circuit which makes the combined resistance value after the adjustment by cutting the one or more fuses greater than the combined resistance value before the adjustment by cutting the one or more fuses and a second trimming circuit which makes the combined resistance value after the adjustment by cutting the one or more fuses less than the combined resistance value before the adjustment by cutting the one or more fuses. The first trimming circuit is connected to the reference resistor in series and the second trimming circuit is connected to the reference resistor in parallel. The first trimming circuit includes a plurality of circuits connected in series in which circuit a resistor is connected with the fuse in parallel, and the second trimming circuit includes one or more resistors connected with the reference resistor in parallel, one or more first switching units connected with the corresponding resistors in series, and one or more control circuits having the fuses which control ON/OFF of the corresponding first switching units. Each of the control circuits switches the first switching unit from OFF to ON when one of the fuses in the control circuit is cut.

Effect of the Invention

According to an embodiment of the present invention, a trimming circuit and a semiconductor device using the trimming circuit can be provided. The trimming circuit can increase or decrease a combined resistance value in which a resistance value of a reference resistor is combined with a resistance value obtained by cutting one or more fuses in the trimming circuit without using a Zener diode.

BRIEF DESCRIPTION OF THE DRAWINGS

Features and advantages of the present invention will become more apparent from the following detailed description when read in conjunction with the accompanying drawings, in which.

DESCRIPTION OF THE PREFERRED EMBODIMENTS

Best Mode of Carrying Out the Invention

The best mode of carrying out the present invention is described with reference to the accompanying drawings.

In embodiments of the present invention, a trimming circuit includes a first trimming circuit having resistors and fuses and a second trimming circuit having resistors and fuses. The first trimming circuit is connected to a reference resistor in series and the second trimming circuit is connected to the reference resistor in parallel. With this, a combined resistance value in which a resistance value of the reference resistor is combined with resistance values of the resistors in the trimming circuit can be increased or decreased without using a Zener diode.

First Embodiment

Figure 4:
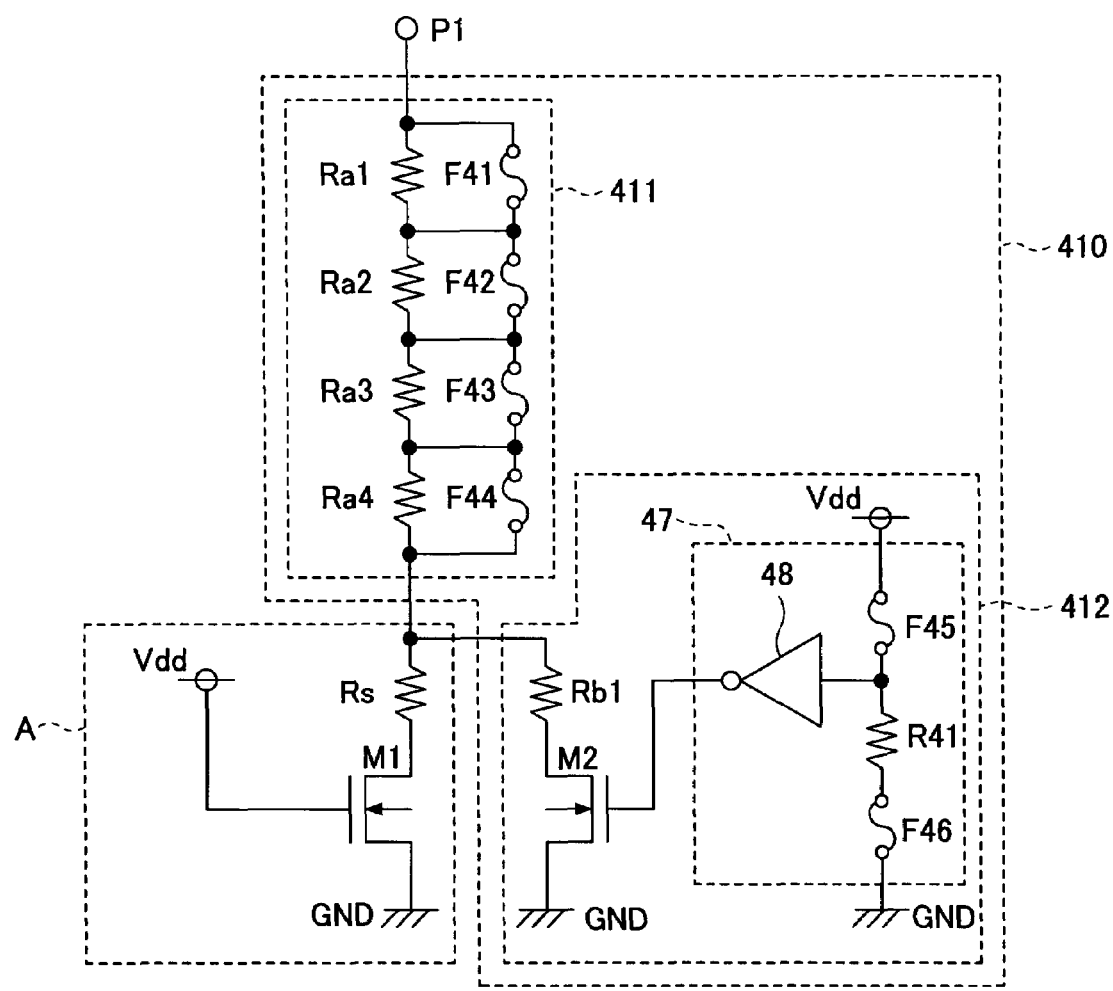
FIG. 4 is a circuit diagram of a semiconductor device having a trimming circuit according to a first embodiment of the present invention.

Referring to the drawing, a first embodiment of the present invention is described. FIG. 4 is a circuit diagram of a semiconductor device 400 having a trimming circuit 410 according to the first embodiment of the present invention.

As shown in FIG. 4, the semiconductor device 400 includes the trimming circuit 410 and a reference resistor section A connected to the trimming circuit 410. The trimming circuit 410 and the reference resistor section A are connected between a terminal P1 and a ground terminal GND. In the semiconductor device 400, a combined resistance value R between the terminal P1 and the ground terminal GND is adjusted to a target resistance value Rd in the trimming circuit 410. The combined resistance value R is used for a circuit (not shown) connected to the terminal P1. The target resistance value Rd is predetermined when designing a circuit in an IC chip corresponding to, for example, characteristics of the IC chip.

First, the reference resistor section A is described.

The reference resistor section A includes a reference resistor Rs and an NMOS transistor M1 (switching unit). One end of the reference resistor Rs is connected to the source of the NMOS transistor M1 and the other end of the reference resistor Rs is connected to the trimming circuit 410. The drain of the NMOS transistor M1 is connected to the ground terminal GND. A power source voltage Vdd is applied to the gate of the NMOS transistor M1 and the NMOS transistor M1 is always ON.

Next, the trimming circuit 410 is described.

The trimming circuit 410 includes a first trimming circuit 411 and a second trimming circuit 412. The first trimming circuit 411 is connected to the reference resistor section A in series and the second trimming circuit 412 is connected to the reference resistor section A in parallel.

In the trimming circuit 410, the combined resistance value R between the terminal P1 and the ground terminal GND can be greater than the resistance value of the reference resistor Rs by adjustment in the first trimming circuit 411, and can be less than the resistance value of the reference resistor Rs by adjustment in the second trimming circuit 412.

The first trimming circuit 411 includes resistors Ra1, Ra2, Ra3, and Ra4 connected in series between the terminal P1 and the reference resistor section A, and a fuse F41 connected with the resistor Ra1 in parallel, a fuse F42 connected with the resistor Ra2 in parallel, a fuse F43 connected with the resistor Ra3 in parallel, and a fuse F44 connected with the resistor Ra4 in parallel.

In the first trimming circuit 411 before adjustment, since the fuses F41 through F44 form a short circuit, a combined resistance value Ra in the first trimming circuit 411 is approximately 0 KΩ.

In the first trimming circuit 411, by cutting appropriate one or more fuses F41 through F44, the combined resistance value Ra can be a combination of the sum of the resistance values of one or more resistors Ra1 through Ra4. Since the combined resistance value R is the sum of the combined resistance value Ra and the resistance value of the reference resistor Rs, the combined resistance value R can be greater than the resistance value of the reference resistor Rs by cutting one or more fuses F41 through F44 in the first trimming circuit 411.

In the present embodiment, the resistance value of each of the resistors Ra1 through Ra4 is predetermined in the following. When the resistance value of the resistor Ra1 is defined as Ka, the resistance value of the resistor Ra2 is Ka×2, the resistance value of the resistor Ra3 is Ka×3, and the resistance value of the resistor Ra4 is Ka×4. That is, when the number of resistors in the first trimming circuit 411 is "n" (n is an integer), the resistance value of each resistor is shown in Equation (1).

$$Ran = Ka \times 2^{(n-1)} \qquad \text{Equation (1)}$$

When the resistance value of the resistors in the first trimming circuit 411 is determined by Equation (1), the combined resistance value Ra can be determined as a value in which several values are combined by the "n" resistors.

The fuses F41 through F44 can be cut by, for example, a high energy laser beam.

The second trimming circuit 412 includes a resistor Rb1 connected with the reference resistor Rs in parallel, an NMOS transistor M2 (switching unit) connected with the resistor Rb1 in series, and a control circuit 47 for controlling ON/OFF of the NMOS transistor M2. The drain of the NMOS transistor M2 is connected to the ground terminal GND.

The control circuit 47 includes a resistor 41, fuses F45 and F46, and an inverter circuit 48. An output terminal of the inverter circuit 48 is connected to the gate of the NMOS transistor M2. One end of the resistor 41 is connected to the power source voltage Vdd via the fuse F45 and the other end of the resistor R41 is connected to the ground terminal GND via the fuse F46. A connection node of the resistor R41 with the fuse F45 is connected to an input terminal of the inverter circuit 48.

In the second trimming circuit 412 before adjustment, a high level (H level) voltage is applied to the input terminal of the inverter circuit 48. At this time, the gate voltage of the NMOS transistor M2 is a low level (L level), and the NMOS transistor M2 is OFF. Therefore, a combined resistance value Rb in the second trimming circuit 412 before the adjustment is essentially infinity (open circuit).

In the second trimming circuit 412, when the fuse F45 is cut by adjustment, the combined resistance value R can be less than the resistance value of the reference resistor Rs.

When the fuse F45 is cut, a voltage applied to the input terminal of the inverter circuit 48 becomes the L level and the gate voltage of the NMOS transistor M2 becomes the H level. Then the NMOS transistor M2 becomes ON, the resistor Rb1 is connected to the reference resistor Rs in parallel, and the combined resistance value R can be lowered.

In the second trimming circuit 412, since the ON/OFF of the NMOS transistor M2 is controlled by the inverter circuit 48, an on-resistance value of the NMOS transistor M2 can be stable. In addition, since the NMOS transistor M1 which is always ON is connected to the NMOS transistor M2 in parallel, the on-resistance value of the NMOS transistor M2 is corrected.

Next, adjustment of the combined resistance value R by the first and second trimming circuits 411 and 412 is described.

In the present embodiment, the resistance value of the reference resistor Rs is determined to be the same as the target resistance value Rd which is a target resistance value after adjustment by trimming. However, the resistance value of the reference resistor Rs has dispersion in the manufacturing process. In the semiconductor device 400, in order that the combined resistance value R between the terminal P1 and the ground terminal GND becomes the target resistance value Rd by offsetting the dispersion, the combined resistance value R is adjusted by using the trimming circuit 410.

First, a first case is described in which the resistance value of the reference resistor Rs is less than the target resistance value Rd.

In this case, in the first trimming circuit 411, when one or more appropriate fuses F41 through F44 are cut, the combined resistance value R can be close to the target resistance value Rd by increasing the combined resistance value R.

In this case, the following is determined in the first trimming circuit 411. That is, when the resistance value of the reference resistor Rs is the minimum value in the dispersion of the manufacturing process, the combined resistance value Ra when all the fuses F41 through F44 are cut is the difference value between the target resistance value Rd and the minimum resistance value of the reference resistor Rs.

That is, the maximum value of the combined resistance value Ra is determined as a maximum fluctuation value in the negative direction of the resistance value of the reference resistor Rs in the dispersion of the manufacturing process of the reference resistor Rs.

Therefore, even if the resistance value of the reference resistor Rs is a minimum value within the dispersion in the manufacturing process, the combined resistance value R can be increased within tolerance of the target resistance value Rd.

In this case, since the resistance value of the reference resistor Rs is less than the target resistance value Rd, it is not necessary for the second trimming circuit 412 to adjust the combined resistance value R. That is, it is not necessary that the resistor Rb1 be connected with the reference resistor Rs in parallel. Therefore, it is enough that the NMOS transistor M2 is in OFF. However, since the resistor R41 and the fuses F45 and F46 are connected to the power source voltage Vdd, an unnecessary current flows into the resistor R41 and the fuses F45 and F46 and power is consumed. In order to solve the above problem, the fuse F45 is cut. With this, the unnecessary current does not flow into the resistor R41 and the fuse F46 and unnecessary power is not consumed.

Next, a second case is described in which the resistance value of the reference resistor Rs is greater than the target resistance value Rd.

In this case, in the second trimming circuit 412, when the fuse F45 is cut, the combined resistance value R can be approximately the target resistance value Rd by adjusting to decrease the combined resistance value R.

Even if the resistance value of the reference resistor Rs is a maximum value within the dispersion in the manufacturing process, the resistance value of the resistor Rb1 is determined to be a value so that the combined resistance value R can be close to the target resistance value Rd within the tolerance of the target resistance value Rd.

In a case where the resistance value of the resistor Rb1 is determined as the above value, when the resistance value of the reference resistor Rs is less than the maximum value within the dispersion in the manufacturing process, the combined resistance value R may be less than the target resistance value Rd by the adjustment in the second trimming circuit 412.

In this case, the second trimming circuit 412 first makes the combined resistance value R low, and then the first trimming circuit 411 adjusts the combined resistance value R to a desired resistance value by making the combined resistance value R high. With this, the combined resistance value R can be within the tolerance of the target resistance value Rd.

When the resistance value of the reference resistor Rs is the target resistance value Rd, the combined resistance value Ra of the first trimming circuit 411 must be a value which can increase the combined resistance value R decreased by the second trimming circuit 412 to the target resistance value Rd.

Therefore, the combined resistance value Ra can be a greater one of the following values. One of the values is a difference resistance value between the minimum resistance value of the reference resistor Rs within the dispersion in the manufacturing process and the target resistance value Rd. The other of the values is a difference resistance value between the combined resistance value R after adjustment by the second trimming circuit 412, which value is less than the target resistance value Rd, and the target resistance value Rd. Since the combined resistance value Ra is the sum of the resistance values of one or more of the resistors Ra1 through Ran, when a small value is desired as the combined resistance value Ra, the greater combined resistance value Ra can be adjusted to the small value.

Next, determination of the resistance values in the trimming circuit 410 is described in specific cases. In order to make the description simple, the on-resistance value of the NMOS transistor M2 is not considered. However, in actual practice, the on-resistance value of the NMOS transistor M2 is considered.

A first case is described. In the first case, the target resistance value Rd is 10 K$\Omega$, and the positive and negative fluctuation ranges of dispersion in the manufacturing process of the resistance value of the reference resistor Rs are the same as ±10%.

When the target resistance value Rd is 10 K$\Omega$, since the resistance value of the reference resistor Rs is determined to be the same value as the target resistance value Rd, the resistance value of the reference resistor Rs must be 10 K$\Omega$. However, the resistance value of the reference resistor Rs is 11 K$\Omega$ in the maximum and 9 K$\Omega$ in the minimum within the dispersion in the manufacturing process.

First, the combined resistance value Ra in the first trimming circuit 411 is described. In the first trimming circuit 411, when the resistance value of the reference resistor Rs fluctuates to 9 K$\Omega$, since the target resistance value Rd is 10 K$\Omega$, the combined resistance value Ra must be 1 K$\Omega$.

When the resistors Ra1 through Ra4 in the first trimming circuit 411 are manufactured by a similar process to the process manufacturing the reference resistor Rs, a similar fluctuation to the resistance value of the reference resistor Rs occurs in the resistors Ra1 through Ra4. For example, when the resistance value of the reference resistor Rs is the minimum value, the resistance values of the resistors Ra1 through Ra4 are corresponding minimum values within the dispersion in the manufacturing process. In order that the combined resistance value Ra becomes 1 K$\Omega$, it is designed that the desired value of the combined resistance value Ra is 1.1 K$\Omega$.

Next, the combined resistance value Rb in the second trimming circuit 412 is described. In the present embodiment, since the second trimming circuit 412 includes only one resistor Rb1, the combined resistance value Rb in the second trimming circuit 412 is the resistance value of the resistor Rb1. However, in the following embodiment of the present invention (described below), since plural resistors are included, the combined resistance value is obtained by combining resistance values of the plural resistors.

In the second trimming circuit 412, when the resistance value of the reference resistor Rs fluctuates to 11 K$\Omega$, the combined resistance value R must be adjusted to 10 K$\Omega$. Since the combined resistance value R is determined by combining the resistance value of the reference resistor Rs with the resistance value of the resistor Rb1, the resistance value of the resistor Rb1 is 110 K$\Omega$.

When the resistor Rb1 in the second trimming circuit 412 is manufactured by a similar process to the process manufacturing the reference resistor Rs, a similar fluctuation to the resistance value of the reference resistor Rs occurs in the resistance value of the resistor Rb1. When the resistance value of the reference resistor Rs is the maximum value, the resistance value of the resistor Rb1 is a maximum value within the dispersion in the manufacturing process. In this case, it can be designed that the desired resistance value of the resistor Rb1 is 100 KΩ.

In a case where the combined resistance value Rb in the second trimming circuit 412 is determined to be 100 KΩ as described above, for example, when the resistance value of the reference resistor Rs is less than 11 KΩ, the combined resistance value R after adjustment by the second trimming circuit 412 is less than 10 KΩ.

In order to solve the above problem, the combined resistance value R whose value is less than 10 KΩ after the adjustment by the second trimming circuit 412 is readjusted by the first trimming circuit 411 so that the combined resistance value R becomes 10 KΩ.

Next, the above readjustment of the combined resistance value R is described.

Only when the resistance value of the reference resistor Rs is greater than the target resistance value Rd, the second trimming circuit 412 adjusts the combined resistance value R. Therefore, in the readjustment of the combined resistance value R in the first trimming circuit 411, the first trimming circuit 411 increases the combined resistance value R after the adjustment in the second trimming circuit 412 so that the combined resistance value R becomes the target resistance value Rd.

In this case, since the resistance value of the reference resistor Rs is 10 KΩ and the resistance value of the resistor Rb1 is 100 KΩ, the combined resistance value R is 9.09 KΩ. Since the combined resistance value R must be adjusted to 10 KΩ, the combined resistance value Ra becomes 0.91 KΩ. Since 0.91 KΩ is less than 1 KΩ of the combined resistance value Ra described above, the combined resistance value Ra of 1 KΩ greater than 0.91 KΩ can be used.

Next, a second case is described. In the second case, the target resistance value Rd is 10 KΩ, and the positive fluctuation range is different from the negative fluctuation range in the dispersion of the resistance values of the reference resistor Rs in the manufacturing process. For example, the positive fluctuation range is 20% and the negative fluctuation range is 10%.

Under the above condition, when the target resistance value Rd after the adjustment by the trimming is 10 KΩ, within the dispersion of the resistance values of the reference resistor Rs in the manufacturing process, the maximum resistance value of the reference resistor Rs is 12 KΩ and the minimum resistance value of the reference resistor Rs is 9 KΩ.

In this case, the combined resistance value R in the second trimming circuit 412 is described.

When the resistance value of the reference resistor Rs is 12 KΩ, the second trimming circuit 412 must adjust so that the combined resistance value R becomes 10 KΩ. That is, the combined resistance value Rb (the resistance value of the resistor Rb1) in the second trimming circuit 412 is determined so that a resistance value combining the resistance value of the reference resistor Rs with the resistance value of the resistor Rb1 becomes 10 KΩ. In this case, the resistance value of the resistor Rb1 is determined to be 60 KΩ. In this, when the dispersion of the resistance values of the resistor Rb1 in the manufacturing process is considered, a desired resistance value of the resistor Rb1 can be approximately 50 KΩ.

Next, the combined resistance value Ra in the first trimming circuit 411 is described.

When the resistance value of the reference resistor Rs is 9 KΩ of the minimum value, as described above, the combined resistance value Ra is 1 KΩ, and a desired resistance value of the combined resistance value Ra can be 1.1 KΩ or more by considering the dispersion of the resistance values in the manufacturing process.

However, in a case where the resistance value of the reference resistor Rs is 10 KΩ, when the second trimming circuit 412 adjusts the combined resistance value R by trimming, since the combined resistance value Rb is 50 KΩ, the combined resistance value R becomes 8.33 KΩ.

Therefore, the combined resistance value Ra in the first trimming circuit 411 must be a value which can adjust the combined resistance value R to the target resistance value Rd of 10 KΩ. When the desired value of the combined resistance value Ra is 1.1 KΩ, the combined resistance value R cannot be adjusted to 10 KΩ. In this case, it is designed that the combined resistance value Ra is 1.67 KΩ.

As described above, when the adjustable resistance value range is optimized by determining the resistance values in the first and second trimming circuits 411 and 412, the trimming can be accurately and surely executed by the minimum number of resistors.

In the present embodiment, the number of the resistors in the first trimming circuit 411 is four; however, the number of the resistors can be increased or decreased corresponding to the required accuracy of the adjustment by the trimming. In addition, one end of the second trimming circuit 412 is grounded; however, when the NMOS transistors M1 and M2 are replaced by analog switches, the analog switches do not need to be grounded. Further, it is preferable that the on-resistance value ratio between the NMOS transistors M1 and M2 be the same as the resistance value ratio between the resistance value of the reference resistor Rs and the resistance value of the resistor Rb1.

As described above, according to the first embodiment of the present invention, the trimming circuit 410 and the semiconductor device 400 using the trimming circuit 410 can be provided in which the combined resistance value R in which the resistance value of the reference resistor Rs is combined with the resistance value in the trimming circuit 410 can be increased or decreased without using a Zener diode. Therefore, a terminal for applying a high reverse bias voltage is not required in designing the semiconductor device 400. Consequently, the chip area and the cost of the semiconductor device 400 can be decreased.

In addition, according to the first embodiment of the present invention, since the resistance value of the reference resistor Rs is determined to be the target resistance value Rd after the adjustment by the trimming, the resistance value to be adjusted by the trimming can be small; with this, the adjustment accuracy by the trimming can be increased.

Second Embodiment

Figure 5:
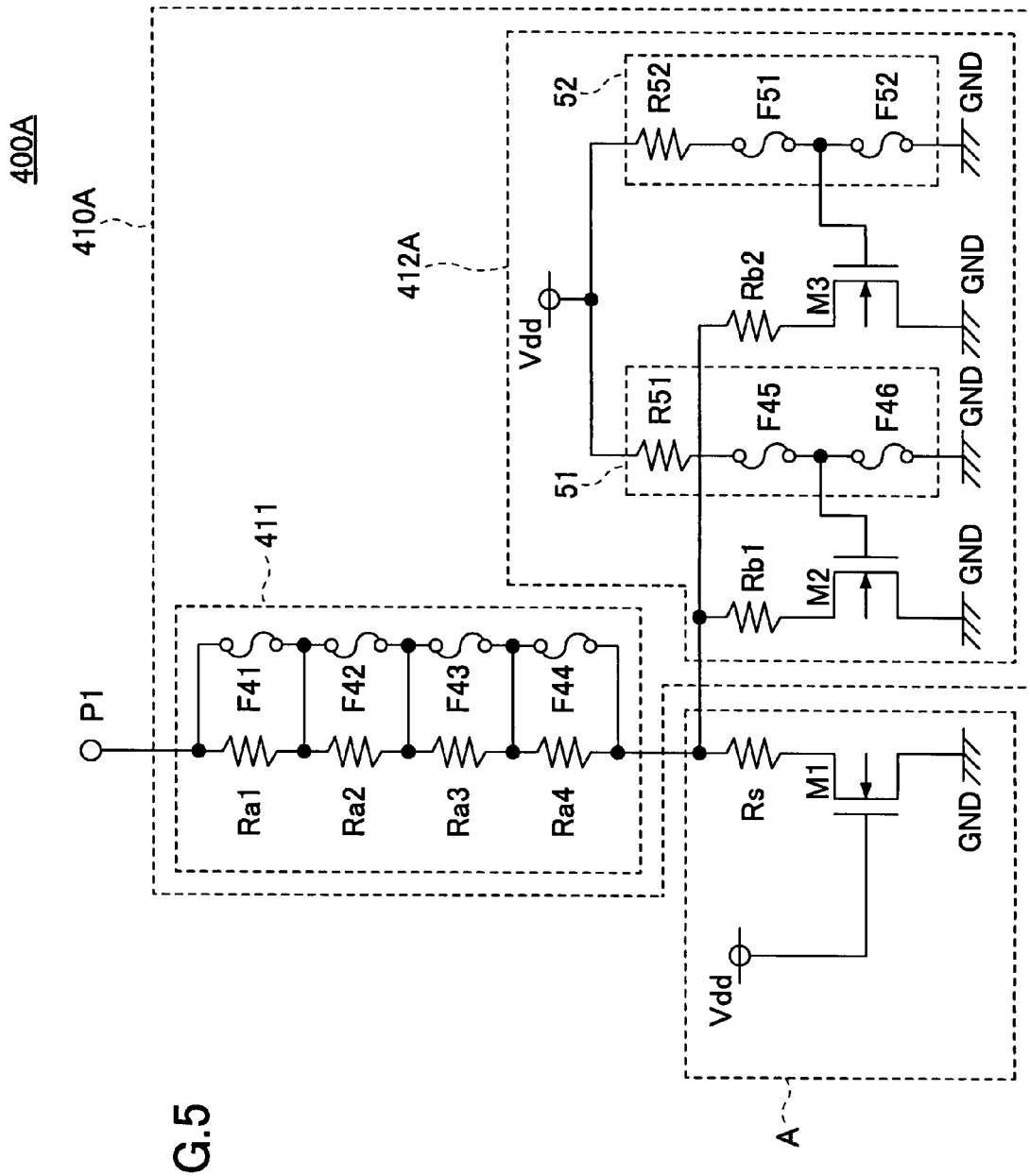
FIG. 5 is a circuit diagram of a semiconductor device having a trimming circuit according to a second embodiment of the present invention.

Referring to the drawing, a second embodiment of the present invention is described. FIG. 5 is a circuit diagram of a semiconductor device 400A having a trimming circuit 410A according to the second embodiment of the present invention.

As shown in FIG. 5, in the trimming circuit 410A, the second trimming circuit 412 described in the first embodiment is replaced by a second trimming circuit 412A. Other sections are the same as those described in the first embodiment of the present invention. Therefore, in the second embodiment of the present invention, only the difference from the first embodiment of the present invention is described and the description of the same sections as those in the first embodiment of the present invention is omitted.

The second trimming circuit 412A is connected to the reference resistor section A in parallel and includes resistors Rb1 and Rb2, NMOS transistors M2 and M3, and control circuits 51 and 52.

The resistor Rb1 and the NMOS transistor M2 are connected in series and are connected to the reference resistor Rs in parallel. The control circuit 51 controls ON/OFF of the NMOS transistor M2 and includes a resistor R51, and fuses F45 and F46. One end of the resistor R51 is connected to the power source voltage Vdd and the other end of the resistor R51 is grounded via the fuses F45 and F46. The gate of the NMOS transistor M2 is connected to a connection node of the fuse F45 with the fuse F46.

Since a voltage being applied to the gate of the NMOS transistor M2 is an L level, the NMOS transistor M2 is in OFF.

Similarly, the resistor Rb2 and the NMOS transistor M3 are connected in series and are connected to the reference resistor Rs in parallel. The control circuit 52 controls ON/OFF of the NMOS transistor M3 and includes a resistor R52, and fuses F51 and F52. One end of the resistor R52 is connected to the power source voltage Vdd and the other end of the resistor R52 is grounded via the fuses F51 and F52. The gate of the NMOS transistor M3 is connected to a connection node of the fuse F51 with the fuse F52.

Since a voltage being applied to the gate of the NMOS transistor M3 is an L level, the NMOS transistor M3 is in OFF. Therefore, a combined resistance value RbA in the second trimming circuit 412A before trimming is essentially infinity (open circuit).

In the second trimming circuit 412A, the combined resistance value R can be made less than the resistance value of the reference resistor Rs, by cutting the fuse F46 or the fuse F52, or cutting both the fuses F46 and F52.

When the fuse F46 or the fuse F52 is cut, or both the fuses F46 and F52 are cut, the NMOS transistor M2 or the NMOS transistor M3 is ON, or both the NMOS transistor M2 and the NMOS transistor M3 are ON. Then the resistor Rb1 or the resistor Rb2, or both the resistor Rb1 and the resistor Rb2 are connected with the reference resistor Rs in parallel, and the combined resistance value R between the terminal P1 and the ground terminal GND can be decreased close to the target resistance value Rd.

In the present embodiment, the resistance value of each of the resistors Rb1 and Rb2 is predetermined in the following. When the resistance value of the resistor Rb1 is defined as Kb, the resistance value of the resistor Rb2 is Kb×2. That is, when the number of resistors which are connected with the reference resistor Rs in parallel in the second trimming circuit 412A is "n" (n is an integer), the resistance value of each resistor is shown in Equation (2).

$$Rbn = Kb \times 2^{(n-1)} \quad \text{Equation (2)}$$

In the control circuits 51 and 52 according to the second embodiment of the present invention, the inverter circuit 48 shown in FIG. 4 according to the first embodiment of the present invention is omitted. However, when the resistance values of the resistors Rb1 and Rb2 are high, the on-resistance values of the NMOS transistors M2 and M3 may be unstable caused by an influence such as noise. Therefore, an inverter circuit similar to that shown in FIG. 4 can be provided in each of the control circuits 51 and 52.

Next, the adjustment of the combined resistance value R by the first trimming circuit 411 and the second trimming circuit 412A is described.

When the resistance value of the reference resistor Rs is less than the target resistance value Rd, the adjustment by the trimming is similar to that in the first embodiment of the present invention. However, in the second trimming circuit 412A, the fuses F45 and F51 are cut and an unnecessary current flowing into the second trimming circuit 412A is cut.

Next, a case is described. In this case, the resistance value of the reference resistor Rs is greater than the target resistance value Rd.

When the resistance value of the reference resistor Rs is greater than the target resistance value Rd, in the second trimming circuit 412A, the fuse F46 or the fuse F52 is cut, or both the fuses F46 and F52 are cut; with this, the combined resistance value R is decreased by the trimming.

The combined resistance value RbA in the second trimming circuit 412A is determined so that the combined resistance value R by the second trimming circuit 412A is within the tolerance of the target resistance value Rd when the resistance value of the reference resistor Rs is a maximum resistance value within the dispersion in the manufacturing process.

Next, determination of the resistance values in the trimming circuit 410A is described in specific cases.

A first case is described. In the first case, similar to the first embodiment of the present invention, the target resistance value Rd of the combined resistance value R after the adjustment is 10 KΩ, and in the dispersion in the manufacturing process of the resistance value of the reference resistor Rs, the positive fluctuation range is 20% and the negative fluctuation range is 10%. In this case, a desired value of the resistance value of the reference resistor Rs is 10 KΩ, and in the dispersion, the maximum resistance value of the reference resistor Rs is 12 KΩ and the minimum resistance value of the reference resistor Rs is 9 KΩ.

The combined resistance value RbA is determined so that the combined resistance value R is adjusted to 10 KΩ when the resistance value of the reference resistor Rs is 12 KΩ. Since the resistors Rb1 and Rb2 are manufactured by the same process as that of the reference resistor Rs, the resistors Rb1 and Rb2 have the same fluctuation ranges as those of the reference resistor Rs.

Therefore, the combined resistance value RbA is determined to be 60 KΩ when the resistance values of the resistors Rb1 and Rb2 are the corresponding maximum values within the dispersion in the manufacturing process. When the dispersion of the resistance values of the resistor Rb1 and Rb2 in the manufacturing process is considered, the combined resistance value RbA can be approximately 50 KΩ.

In the present embodiment, as described above, it is determined that the resistance value of the resistor Rb2 is Kb×2 when the resistance value of the resistor Rb1 is Kb. That is, the ratio between the resistance values of the resistors Rb1 and Rb2 is 1 to 2. Therefore, when the resistance value of the resistor Rb1 is 75 KΩ and the resistance value of the resistor Rb2 is 150 KΩ, the combined resistance value RbA can be 50 KΩ.

In addition, in the second trimming circuit 412A, the resistance values of the resistors Rb1 and Rb2 can be changed corresponding to the fluctuation range of the resistance value of the reference resistor Rs.

For example, in the resistance value of the reference resistor Rs, the fluctuation range of 0% to 6.66% (20/3) is defined as a first fluctuation range, the fluctuation range of 6.67% to 13.33% (20×2/3) is defined as a second fluctuation range, and the fluctuation range of 13.34% to 20% is defined as a third fluctuation range.

When the resistance value of the reference resistor Rs is in the first fluctuation range, the second trimming circuit 412A cuts the fuse F52, and the resistor Rb2 is connected to the reference resistor Rs in parallel. When the resistance value of the reference resistor Rs is in the second fluctuation range, the second trimming circuit 412A cuts the fuse F46, and the resistor Rb1 is connected to the reference resistor Rs in parallel. In addition, when the resistance value of the reference resistor Rs is in the third fluctuation range, the second trimming circuit 412A cuts the fuses F46 and F52, and the resistors Rb1 and Rb2 are connected to the reference resistor Rs in parallel.

Next, actual numerical values are used.

In the second trimming circuit 412A, in each of the above fluctuation ranges, when the fluctuation value of the resistance value of the reference resistor Rs is a maximum value, the resistance values of the resistors Rb1 and Rb2 are determined so that the combined resistance value R is adjusted to 10 KΩ.

For example, the maximum fluctuation value in the first fluctuation range of the resistance value of the reference resistor Rs is 6.66%. That is, the resistance value of the reference resistor Rs is 10.66 KΩ. Therefore, the second trimming circuit 412A determines the resistance value of the resistor Rb2 so that the combined resistance value R is 10 KΩ when the resistor Rb2 is connected to the reference resistor Rs in parallel. Therefore, when the resistance value of the resistor Rb2 is determined as 160 KΩ, the combined resistance value R can be almost 10 KΩ. At this time, the resistance value of the resistor Rb1 is 80 KΩ.

Similarly, the maximum fluctuation value in the second fluctuation range of the resistance value of the reference resistor Rs is 13.33%. That is, the resistance value of the reference resistor Rs is 11.33 KΩ. Therefore, the second trimming circuit 412A determines the resistance value of the resistor Rb1 so that the combined resistance value R is 10 KΩ when the resistor Rb1 is connected to the reference resistor Rs in parallel. Therefore, when the resistance value of the resistor Rb1 is determined as 85 KΩ, the combined resistance value R can be almost 10 KΩ. At this time, the resistance value of the resistor Rb2 is 170 KΩ.

In addition, the maximum fluctuation value in the third fluctuation range of the resistance value of the reference resistor Rs is 20%. That is, the resistance value of the reference resistor Rs is 12 KΩ. Therefore, the second trimming circuit 412A determines the resistance values of the resistors Rb1 and Rb2 so that the combined resistance value R is 10 KΩ when the resistors Rb1 and Rb2 are connected to the reference resistor Rs in parallel. Therefore, when the resistance value of the resistor Rb1 is determined as 90 KΩ and the resistance value of the resistor Rb2 is determined as 180 KΩ, the combined resistance value R can be almost 10 KΩ.

That is, when the resistance value of the reference resistor Rs is in the first fluctuation range, the resistance value of the resistor Rb1 is determined as 80 KΩ and the resistance value of the resistor Rb2 is determined as 160 KΩ. When the resistance value of the reference resistor Rs is in the second fluctuation range, the resistance value of the resistor Rb1 is determined as 85 KΩ and the resistance value of the resistor Rb2 is determined as 170 KΩ. In addition, when the resistance value of the reference resistor Rs is in the third fluctuation range, the resistance value of the resistor Rb1 is determined as 90 KΩ and the resistance value of the resistor Rb2 is determined as 180 KΩ.

As described above, when the resistance values of the resistors Rb1 and Rb2 are determined in each of the above fluctuation ranges, the combined resistance value R can be surely adjusted to a value close to the target resistance value Rd corresponding to each of the fluctuation ranges of the resistance value of the reference resistor Rs.

Next, in each of the above fluctuation ranges, readjustment of the combined resistance value R by the first trimming circuit 411 after the adjustment by the second trimming circuit 412A is described.

First, in each of the fluctuation ranges, the combined resistance value R by the second trimming circuit 412A is calculated when the fluctuation value of the resistance value of the reference resistor Rs is a minimum value. Then a necessary resistance value which makes the combined resistance value R 10 KΩ is calculated in each of the fluctuation ranges. The combined resistance value Ra in the first trimming circuit 411 must be determined to be able to adjust the necessary resistance value.

For example, the minimum fluctuation value in the first fluctuation range of the resistance value of the reference resistor Rs is 0%. That is, the resistance value of the reference resistor Rs is 10 KΩ. Since the resistance value of the resistor Rb2 is 160 KΩ in the first fluctuation range, the combined resistance value R by the second trimming circuit 412A is a resistance value in which the resistance value of the reference resistor Rs of 10 KΩ is combined with the resistance value of the resistor Rb2 of 160 KΩ. That is, the combined resistance value R after the adjustment is 9.41 KΩ. Consequently, the combined resistance value Ra which is necessary to adjust the combined resistance value R to 10 KΩ is 0.59 KΩ.

Similarly, the minimum fluctuation value in the second fluctuation range of the resistance value of the reference resistor Rs is 6.67%. That is, the resistance value of the reference resistor Rs is 10.67 KΩ. Since the resistance value of the resistor Rb1 is 85 KΩ in the second fluctuation range, the combined resistance value R by the second trimming circuit 412A is a resistance value in which the resistance value of the reference resistor Rs of 10.67 KΩ is combined with the resistance value of the resistor Rb1 of 85 KΩ. That is, the combined resistance value R after the adjustment is 9.47 KΩ. Consequently, the combined resistance value Ra which is necessary to adjust the combined resistance value R to 10 KΩ is 0.53 KΩ.

In addition, the minimum fluctuation value in the third fluctuation range of the resistance value of the reference resistor Rs is 13.34%. That is, the resistance value of the reference resistor Rs is 11.33 KΩ. Since the resistance value of the resistor Rb1 is 90 KΩ and the resistance value of the resistor Rb2 is 180 KΩ in the third fluctuation range, the combined resistance value R by the second trimming circuit 412A is a resistance value in which the resistance value of the reference resistor Rs of 11.33 KΩ is combined with the resistance value of the resistor Rb1 of 90 KΩ and the resistance value of the resistor Rb2 of 180 KΩ. That is, the combined resistance value R after the adjustment is 9.53 KΩ. Consequently, the combined resistance value Ra which is necessary to adjust the combined resistance value R to 10 KΩ is 0.47 KΩ.

As described above, the minimum value of the combined resistance value R by the second trimming circuit 412A in the three fluctuation ranges is 9.41 KΩ. Therefore, the necessary combined resistance value Ra to adjust the combined resistance value R to 10 KΩ is 0.59 KΩ. When the combined resistance value Ra is determined as 1.0 KΩ, the combined resistance value Ra of 1.0 KΩ greater than 0.59 KΩ can be used.

As described above, since the resistance values of the resistors in the trimming circuit 410A are changed corresponding to the fluctuation value of the resistance value of the reference resistor Rs, the trimming can be surely executed with high accuracy.

In the above description, the resistance value of the reference resistor Rs is determined to be equal to the target resistance value Rd, the dispersion of the resistance values in the manufacturing process is adjusted by the trimming, and the combined resistance value R is within the tolerance of the target resistance value Rd. However, according to the trimming circuit 410, when the value of each resistor is suitably determined, even if the resistance value of the reference resistor Rs is different from the target resistance value Rd, the combined resistance value R can be adjusted within the tolerance of the target resistance value Rd.

For example, it is determined that the resistance value of the reference resistor Rs is 100 KΩ and the resistance value of the resistor Ra1 is 1 KΩ, the resistance value of the resistor Ra2 is 2 KΩ, the resistance value of the resistor Ra3 is 4 KΩ, and the resistance value of the resistor Ra4 is 8 KΩ in the first trimming circuit 411. In addition, the resistance value of the resistor Rb1 in the second trimming circuit 412 is determined as 100 KΩ which is the same value as that of the reference resistor Rs. When the resistance values of the resistors in the first trimming circuit 411 are determined as above, the target resistance value Rd can be determined in the range of 50% to 115% of the resistance value of the reference resistor Rs.

Next, referring again to FIG. 4, a case is described in which case the target resistance value Rd is determined as 65 KΩ, or 65% of the resistance value of the reference resistor Rs of 100 KΩ.

In the trimming circuit 410, first, the fuse F45 in the second trimming circuit 412 is cut. With this, the reference resistor Rs is connected to the resistor Rb1 in parallel and the combined resistance value R becomes 50 KΩ which is 50% of the resistance value of the reference resistor Rs.

Next, the combined resistance value R of 50 KΩ is adjusted to 65 KΩ which is the target resistance value Rd. In this case, 15 KΩ is required. Since the 15 KΩ is the maximum value of the combined resistance value Ra in the first trimming circuit 411, the fuses F41 through F44 in the first trimming circuit 411 are cut.

By the above cutting of the fuses F41 through F44, the combined resistance value R becomes the target resistance value Rd of 65 KΩ by adding 15 KΩ to 50 KΩ. With this, the combined resistance value R can be within the tolerance of the target resistance value Rd.

As described above, in the trimming circuit 410, even if the target resistance value Rd is not the same as the resistance value of the reference resistor Rs, the combined resistance value R can be adjusted within the tolerance of the target resistance value Rd.

In addition, in the first trimming circuit 411, for example, a resistor Ra5 of 16 KΩ (not shown) and a resistor Ra6 of 32 KΩ (not shown) can be connected in series between the resistor Ra4 and the reference resistor Rs. In this case, the target resistance value Rd can be determined in the range of 50% to 163% of the resistance value of the reference resistor Rs. That is, the target resistance value Rd can be determined in a wider range.

In the present embodiment, the trimming circuit 410 is used. However, the trimming circuit 410A can be used instead of using the trimming circuit 410. When the trimming circuit 410A is used, the target resistance value Rd can be determined in the range of 33.3% to 163% of the resistance value of the reference resistor Rs.

Third Embodiment

Figure 6:
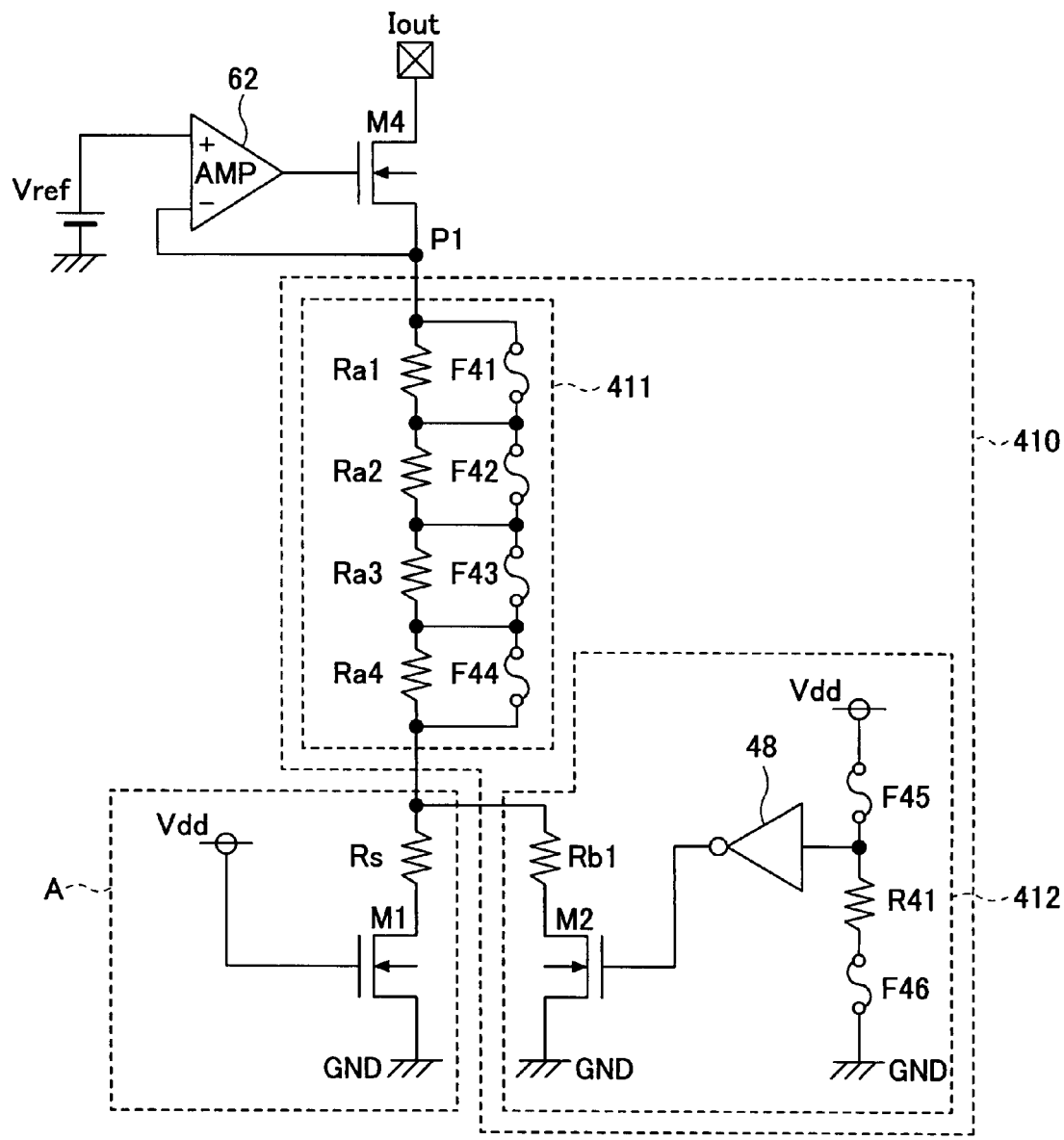
FIG. 6 is a circuit diagram of a semiconductor device having the trimming circuit shown in FIG. 4 according to a third embodiment of the present invention.

Referring to the drawing, a third embodiment of the present invention is described. FIG. 6 is a circuit diagram of a semiconductor device 600 having the trimming circuit 410 according to the third embodiment of the present invention. The semiconductor device 600 according to the third embodiment of the present invention is a constant-current circuit including the trimming circuit 410 and the reference resistor section A described in the first embodiment of the present invention. Therefore, the description of the trimming circuit 410 and the reference resistor section A is omitted.

The semiconductor device 600 of the constant-current circuit includes a reference voltage Vref, an operational amplifier (AMP) 62, an NMOS transistor M4, the trimming circuit 410, and the reference resistor section A.

The reference voltage Vref is applied to the non-inverting input terminal of the AMP 62, and the inverting input terminal of the AMP 62 is connected to the terminal P1 of the trimming circuit 410. The output terminal of the AMP 62 is connected to the gate of the NMOS transistor M4.

The source of the NMOS transistor M4 is connected to a connection node of the AMP 62 with the terminal P1 of the trimming circuit 410, and the drain of the NMOS transistor M4 is the constant-current output terminal Iout.

The output current from the semiconductor device 600 before the trimming by the trimming circuit 410 is a value in which the reference voltage Vref is divided by the reference resistor Rs, that is, Vref/Rs.

In the trimming circuit 410, it is determined that the resistance value of the reference resistor Rs is the target resistance value Rd which is a target value after the trimming. Therefore, when the current capacity of the NMOS transistor M4 is being determined, only the negative tolerance of the resistance value of the reference resistor Rs is considered. Consequently, the size of the NMOS transistor M4 can be small.

Figure 1:
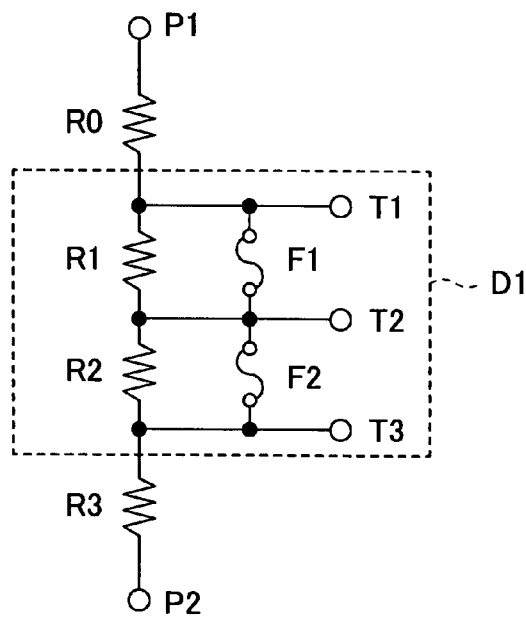
FIG. 1 is a conventional trimming circuit diagram using fuses.
Figure 2:
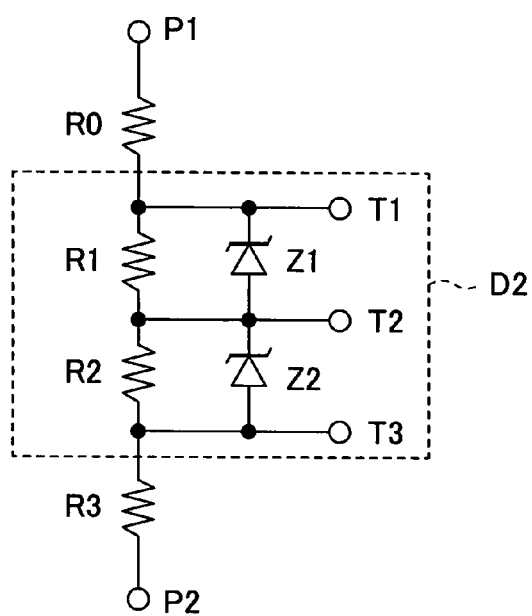
FIG. 2 is a conventional trimming circuit diagram using Zener diodes.
Figure 3:
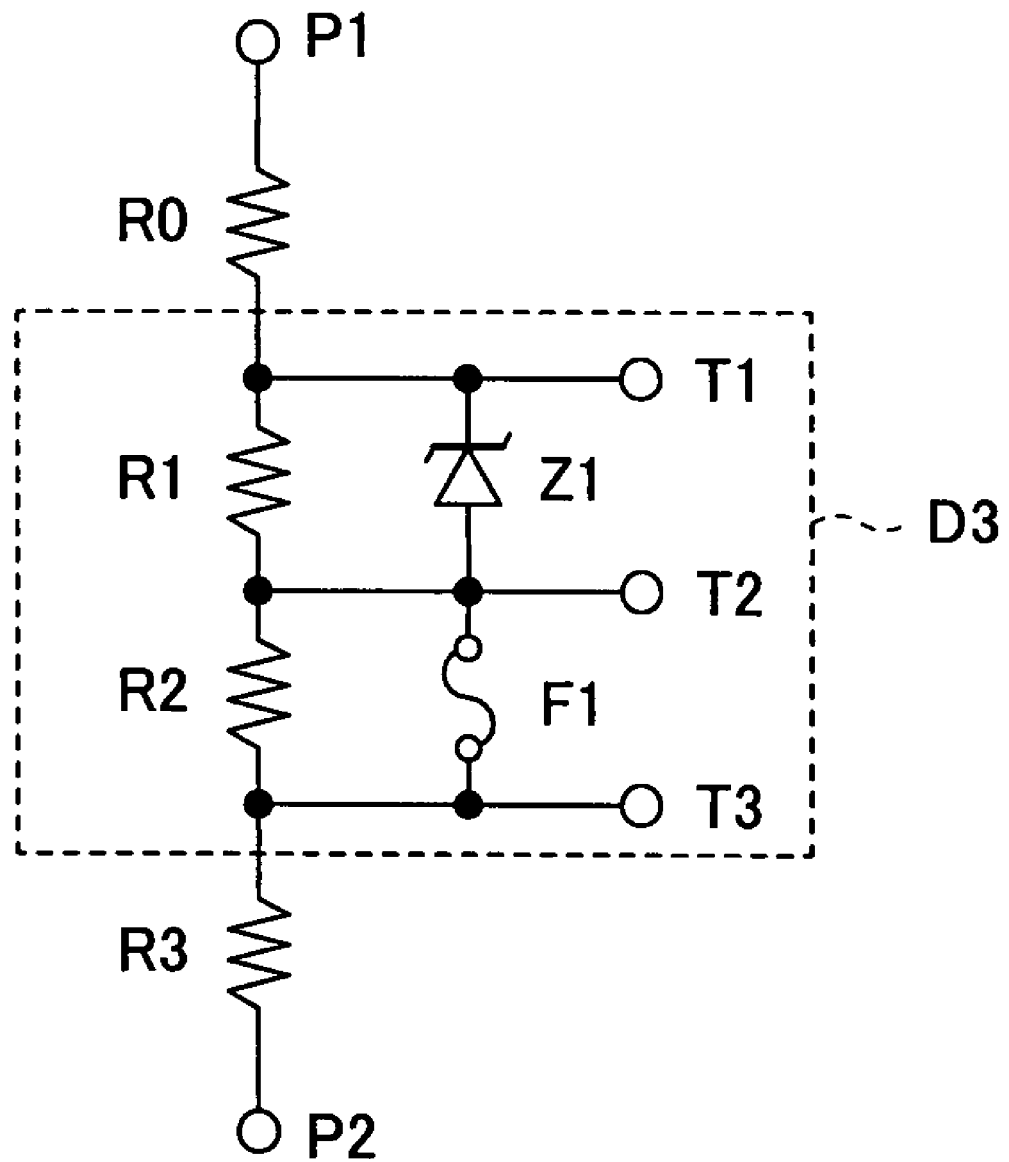
FIG. 3 is a conventional trimming circuit diagram which is disclosed in Patent Document 1.

First, the current capacity of the NMOS transistor M4 is determined in a case where the semiconductor device 600 uses the trimming circuit D1 shown in FIG. 1 instead of using the trimming circuit 410 shown in FIG. 4.

In the trimming circuit D1 shown in FIG. 1, the resistance values of the resistors R0 and R3 are determined so that the maximum value of the combined resistance value between the terminals P1 and P2 becomes the target resistance value by the trimming. Therefore, the combined resistance value of the resistors R0 and R3 is determined to be a value smaller than the target resistance value by an increment (positive tolerance) by the trimming. In addition, by the dispersion in the manufacturing process, the combined resistance value of the resistors R0 and R3 may be less than a value in which the increment is subtracted from the target resistance value.

In this case, before the trimming, the combined resistance value between the terminals P1 and P2 becomes a small value and a current greater than a necessary current may flow into the NMOS transistor M4. Therefore, the current capacity of the NMOS transistor M4 must be greater than the necessary current capacity. Consequently, a large size NMOS transistor must be used for the constant-current circuit.

In the third embodiment of the present invention, since a current flowing into the NMOS transistor M4 can be made small by using the trimming circuit 410, the NMOS transistor M4 can be small-sized. In the present embodiment, the trimming circuit 410 is used. However, the trimming circuit 410A can be used instead of using the trimming circuit 410.

Fourth Embodiment

Figure 7:
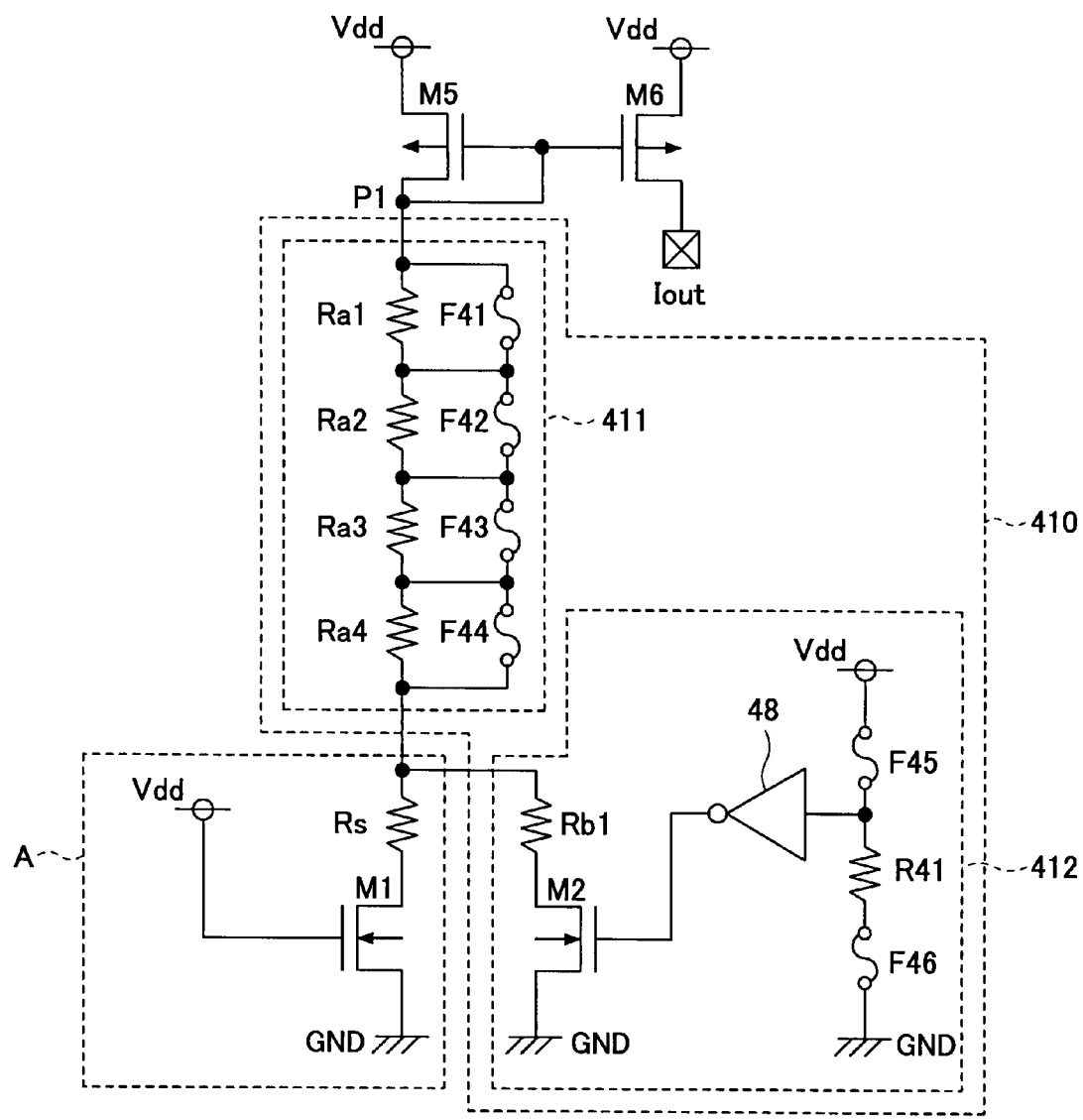
FIG. 7 is a circuit diagram of a semiconductor device having the trimming circuit shown in FIG. 4 according to a fourth embodiment of the present invention.

Referring to the drawing, a fourth embodiment of the present invention is described. FIG. 7 is a circuit diagram of a semiconductor device 700 having the trimming circuit 410 according to the fourth embodiment of the present invention.

The semiconductor device 700 according to the fourth embodiment of the present invention is a current mirror circuit including the trimming circuit 410 and the reference resistor section A described in the first embodiment of the present invention. Therefore, the description of the trimming circuit 410 and the reference resistor section A is omitted.

The semiconductor device 700 includes PMOS transistors M5 and M6, the trimming circuit 410, and the reference resistor section A.

The source of the PMOS transistor MS is connected to the power source voltage Vdd. The drain of the PMOS transistor MS is connected to the terminal P1 of the trimming circuit 410 and is grounded via the trimming circuit 410. The gate of the PMOS transistor M5 is connected to the gate of the PMOS transistor M6 and the drain of the PMOS transistor M5.

The PMOS transistor M6 is a mirror transistor of the PMOS transistor M5. The source of the PMOS transistor M6 is connected to the power source voltage Vdd, and the drain of the PMOS transistor M6 is the current output terminal Iout. A mirror current is output from the current output terminal Iout.

In the trimming circuit 410, the combined resistance value R between the terminal P1 and the ground terminal GND can be almost the same value as the target resistance value Rd. Therefore, the drain voltage of the PMOS transistor M5 can be stable, and an error caused by the channel length modulation effect in the PMOS transistors M5 and M6 can be extremely small.

In the fourth embodiment of the present invention, the trimming circuit 410 is used. However, the trimming circuit 410A can be used instead of using the trimming circuit 410. By using the trimming circuit 410A, the same effect as that by using the trimming circuit 410 can be obtained.

Figure 8:
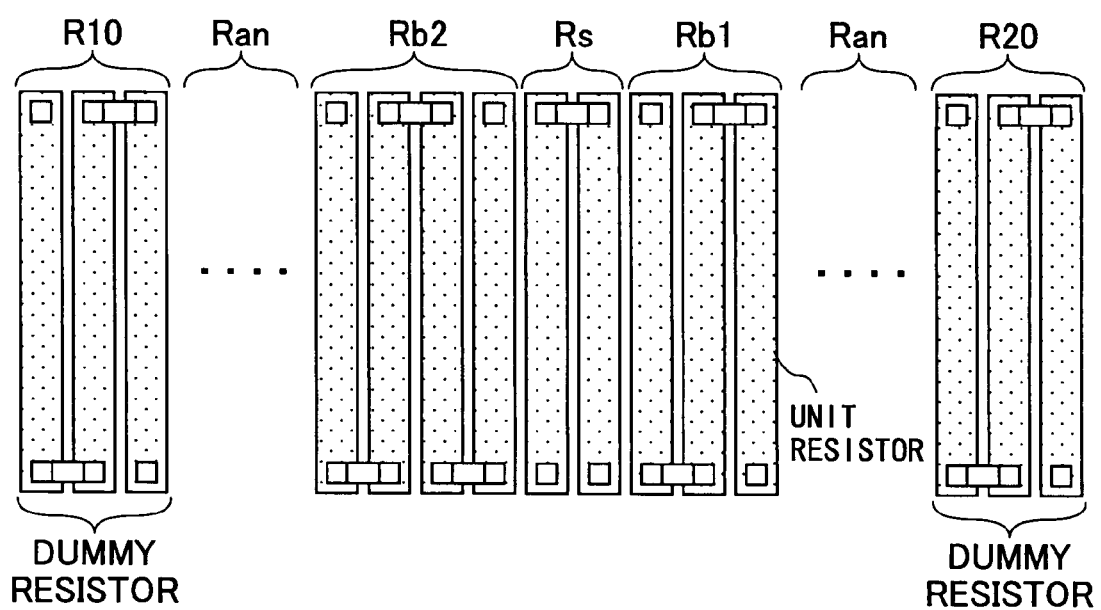
FIG. 8 is a schematic diagram of resistors on an IC chip in the trimming circuit.

Next, the resistors in the trimming circuits 410 and 410A are described in detail. FIG. 8 is a schematic diagram of resistors on an IC chip in the trimming circuit 410/410A.

As shown in FIG. 8, each of the resistors in the trimming circuit 410/410A is formed of unit resistors having a thin and long rectangular shape (stick shape). The unit resistors are arrayed in a predetermined region on the IC chip. The dispersion of the resistance values of the unit resistors in the manufacturing process can be made small by the structure shown in FIG. 8. In addition, the difference among the resistance values of the unit resistors caused by the dispersion in the manufacturing process occurs in the same direction with the almost same ratio; therefore, the resistance ratio among the unit resistors can be almost constant. Further, in FIG. 8, dummy resistors R10 and R20 are shown.

In the trimming circuit 410/410A, when a resistor having a necessary resistance value is obtained, a necessary number of the unit resistors are connected in series or in parallel.

Since the reference resistor Rs in the trimming circuit 410/410A must have the highest accuracy in the resistance value, the reference resistor Rs is formed of the unit resistors at almost near the center in the region. Each of the resistance values of the unit resistors formed near the center has a value closest to an average resistance value of the unit resistors in the many formed unit resistors.

In addition, in the trimming circuit 410/410A, the resistors which must have the second highest accuracy in the resistance value are the resistor Rbn. Therefore, the resistor Rbn is formed of the unit resistors adjacent to the unit resistors of the reference resistor Rs. The resistor Ran is formed of the unit resistors outside the unit resistors of the resistor Rbn.

The accuracy of the resistance values of the resistors in the trimming circuit 410/410A can be maintained by the above structure; therefore, high-accurate trimming can be realized.

The resistance value of the resistor R41 in the control circuit 47 shown in FIG. 4 and the resistance values of the resistors R51 and R52 in the corresponding control circuits 51 and 52 shown in FIG. 5 do not need absolute accuracy. Therefore, the resistors R41, R51, and R52 can be formed of the corresponding resistor at the most outside of the IC chip. That is, the resistors R41, R51, and R52 can be formed of the corresponding dummy resistor R10 or R20. When the dummy resistors R10 and R20 are used for the resistors R41, R51, and R52, the area where the resistors of the control circuits 47, 51, and 52 are formed can be decreased.

Further, the present invention is not limited to the specifically disclosed embodiments, and variations and modifications may be made without departing from the scope of the present invention.

The present invention is based on Japanese Priority Patent Application No. 2006-190558, filed on Jul. 11, 2006, with the Japanese Patent Office, the entire contents of which are hereby incorporated herein by reference.

What is claimed is:

1. A trimming circuit that adjusts a combined resistance value, in which a resistance value of a reference resistor is combined with a resistance value obtained by cutting one or more fuses in the trimming circuit, to a target resistance value, comprising:

a first trimming circuit which makes the combined resistance value after the adjustment by cutting the one or more fuses greater than the combined resistance value before the adjustment by cutting the one or more fuses; and a second trimming circuit which makes the combined resistance value after the adjustment by cutting the one or more fuses less than the combined resistance value before the adjustment by cutting the one or more fuses; wherein the first trimming circuit is connected to the reference resistor in series and the second trimming circuit is connected to the reference resistor in parallel.

2. The trimming circuit as claimed in claim 1, wherein:

the first trimming circuit includes a plurality of circuits connected in series in which circuit a resistor is connected with the fuse in parallel;

the second trimming circuit includes one or more resistors connected with the reference resistor in parallel, one or more first switching units connected with the corresponding resistors in series, and one or more control circuits having the fuses which control ON/OFF of the corresponding first switching units; and each of the control circuits switches the first switching unit from OFF to ON when one of the fuses in the control circuit is cut.

3. The trimming circuit as claimed in claim 1, wherein:

the resistance value of the reference resistor is determined to be a value almost equal to the target resistance value which is the combined resistance value after the adjustment.

4. The trimming circuit as claimed in claim 2, wherein:

when the number of the resistors in the first trimming circuit is defined as "n" (n is an integer), the resistance values of the corresponding resistors are defined as Ra1, Ra2, . . . , and Ran, and the resistance value Ra1 of the first resistor is defined as Ka; the resistance value of each resistor is defined by Equation (1);

$$Ran = Ka \times 2^{(n-1)} \qquad \text{Equation (1)}$$

and when the number of the resistors in the second trimming circuit is defined as "n" (n is an integer), the resistance values of the corresponding resistors are defined as Rb1, Rb2, ..., and Rbn, and the resistance value Rb1 of the first resistor is defined as Kb; the resistance value of each resistor is defined by Equation (2);

$$Rbn = Kb \times 2^{(n-1)} \qquad \text{Equation (2).}$$

5. The trimming circuit as claimed in claim 2, wherein:
a maximum combined resistance value in the first trimming circuit is determined to be a greater value of a difference resistance value between the minimum resistance value of the reference resistor within the dispersion in the manufacturing process and the target resistance value and a difference resistance value between the combined resistance value after adjustment by the second trimming circuit which value is less than the target resistance value and the target resistance value; and
a combined resistance value in the second trimming circuit is determined so that the combined resistance value by the second trimming circuit is within the tolerance of the target resistance value when the resistance value of the reference resistor is a maximum resistance value within the dispersion in the manufacturing process.

6. The trimming circuit as claimed in claim 1, wherein:
a second switching unit is connected with the reference resistor in series and the second switching unit is always ON.

7. The trimming circuit as claimed in claim 2, wherein:
the control circuit includes a series circuit in which at least a resistor and the two fuses are connected in series;
the series circuit is connected between a power source terminal and a ground terminal; and
when the two fuses are not cut after the adjustment of the combined resistance value, one of the two fuses is cut.

8. The trimming circuit as claimed in claim 7, wherein:
the control circuit includes an inverter circuit;
the inverter circuit is connected between a connection point of the resistor with one of the two fuses in the control circuit and the first switching unit; and
the first switching unit is controlled to ON/OFF by an output from the inverter circuit.

9. A semiconductor device, comprising:
a trimming circuit that adjusts a combined resistance value, in which a resistance value of a reference resistor is combined with a resistance value obtained by cutting one or more fuses in the trimming circuit, to a target resistance value; wherein:
the trimming circuit includes
a first trimming circuit which makes the combined resistance value after the adjustment by cutting the one or more fuses greater than the combined resistance value before the adjustment by cutting the one or more fuses; and
a second trimming circuit which makes the combined resistance value after the adjustment by cutting the one or more fuses less than the combined resistance value before the adjustment by cutting the one or more fuses;
the first trimming circuit is connected to the reference resistor in series and the second trimming circuit is connected to the reference resistor in parallel;
the first trimming circuit includes a plurality of circuits connected in series in which circuit a resistor is connected with the fuse in parallel;
the second trimming circuit includes one or more resistors connected with the reference resistor in parallel, one or more first switching units connected with the corresponding resistors in series, and one or more control circuits having the fuses which control ON/OFF of the corresponding first switching units; and
each of the control circuits switches the first switching unit from OFF to ON when one of the fuses in the control circuit is cut.

10. The semiconductor device as claimed in claim 9, further comprising:
an operational amplifier; and
an NMOS transistor; wherein
a non-inverting input terminal of the operational amplifier is connected to a reference voltage, an inverting input terminal of the operational amplifier is connected to a connection point of the source of the NMOS transistor with one terminal of the trimming circuit, and an output terminal of the operational amplifier is connected to the gate of the NMOS transistor; and
a constant current is output from the drain of the NMOS transistor.

11. The semiconductor device as claimed in claim 9, further comprising:
a first PMOS transistor; and
a second PMOS transistor; wherein
the source of the first PMOS transistor is connected to a power source, the drain of the first PMOS transistor is connected to one terminal of the trimming circuit and is grounded via the trimming circuit, and the gate of the first PMOS transistor is connected to the gate of the second PMOS transistor and the drain of the first PMOS transistor; and
the source of the second PMOS transistor is connected to the power source, and a mirror current is output from the drain of the second PMOS transistor.

12. The semiconductor device as claimed in claim 9, wherein:
the resistors in the first trimming circuit and the second trimming circuit are formed by arraying a plurality of stick-shaped resistors in a predetermined region on the semiconductor device;
the reference resistor is formed of the stick-shaped resistors disposed at a center part in the predetermined region;
the resistors in the second trimming circuit are formed of the stick-shaped resistors disposed adjacent to and near the reference resistor;
the resistors in the first trimming circuit are formed of the stick-shaped resistors disposed adjacent to and near the resistors in the second trimming circuit; and
the resistors in the control circuit are formed of the stick-shaped resistors disposed at the most outside in the predetermined region.

13. The semiconductor device as claimed in claim 12, wherein:
the stick-shaped resistors disposed at the most outside in the predetermined region are dummy resistors for making the accuracy of the resistance values of the inside resistors high.

* * * * *